United States Patent
Hamano et al.

(10) Patent No.: US 10,950,435 B2
(45) Date of Patent: Mar. 16, 2021

(54) SIC EPITAXIAL WAFER, METHOD FOR MANUFACTURING SIC EPITAXIAL WAFER, SIC DEVICE, AND POWER CONVERSION APPARATUS

(71) Applicant: Mitsubishi Electric Corporation, Tokyo (JP)

(72) Inventors: Kenichi Hamano, Tokyo (JP); Akihito Ohno, Tokyo (JP); Takuma Mizobe, Fukuoka (JP); Yasuhiro Kimura, Tokyo (JP); Yoichiro Mitani, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 16/474,161

(22) PCT Filed: Apr. 6, 2017

(86) PCT No.: PCT/JP2017/014395
§ 371 (c)(1),
(2) Date: Jun. 27, 2019

(87) PCT Pub. No.: WO2018/185916
PCT Pub. Date: Oct. 11, 2018

(65) Prior Publication Data
US 2020/0020528 A1   Jan. 16, 2020

(51) Int. Cl.
*C30B 25/14* (2006.01)
*H01L 21/02* (2006.01)
(Continued)

(52) U.S. Cl.
CPC ........ *H01L 21/02529* (2013.01); *C30B 25/14* (2013.01); *C30B 29/36* (2013.01);
(Continued)

(58) Field of Classification Search
CPC .......... H01L 21/02529; H01L 29/1608; C30B 29/36
See application file for complete search history.

(56) References Cited

U.S. PATENT DOCUMENTS

2004/0061380 A1* 4/2004 Hann ............... H02J 1/06
307/43
2005/0214455 A1* 9/2005 Li ................... C23C 16/4405
427/248.1
(Continued)

FOREIGN PATENT DOCUMENTS

CN    103649385 A    3/2014
JP    2006-523777 A   10/2006
(Continued)

OTHER PUBLICATIONS

Machine Translation of JP2008-074664 (Year: 2008).*
(Continued)

*Primary Examiner* — Selim U Ahmed
*Assistant Examiner* — Evan G Clinton
(74) *Attorney, Agent, or Firm* — Studebaker & Brackett PC

(57) ABSTRACT

A SiC substrate (1) has an off angle θ°. A SiC epitaxial layer (2) having a film thickness of Tm μm is provided on the SiC substrate (1). Triangular defects (3) are formed on a surface of the SiC epitaxial layer (2). A density of triangular defects (3) having a length of Tm/Tan θ×0.9 or more in a substrate off direction is denoted by A. A density of triangular defects (3) having a length smaller than Tm/Tan θ×0.9 in the substrate off direction is denoted by B. B/A≤0.5 is satisfied.

13 Claims, 7 Drawing Sheets

(51) Int. Cl.
*C30B 29/36* (2006.01)
*H01L 29/06* (2006.01)
*H01L 29/16* (2006.01)
*H02M 7/44* (2006.01)
*H01L 29/78* (2006.01)
*H01L 29/872* (2006.01)
*H02P 27/06* (2006.01)

(52) U.S. Cl.
CPC ........ *H01L 21/02634* (2013.01); *H01L 29/06* (2013.01); *H01L 29/1608* (2013.01); *H02M 7/44* (2013.01); *H01L 29/78* (2013.01); *H01L 29/872* (2013.01); *H02P 27/06* (2013.01)

(56) References Cited

U.S. PATENT DOCUMENTS

| | | | |
|---|---|---|---|
| 2006/0216416 A1 | 9/2006 | Sumakeris et al. | |
| 2014/0145214 A1* | 5/2014 | Kageshima | C30B 25/12 257/77 |
| 2014/0239293 A1* | 8/2014 | Yamazaki | H01L 29/78696 257/43 |
| 2015/0162187 A1 | 6/2015 | Miyasaka et al. | |
| 2019/0376206 A1* | 12/2019 | Fukada | H01L 21/02167 |

FOREIGN PATENT DOCUMENTS

| | | |
|---|---|---|
| JP | 2008074664 A * | 4/2008 |
| JP | 4987792 B2 | 7/2012 |
| JP | 2013-014469 A | 1/2013 |
| JP | 2013-216554 A | 10/2013 |
| JP | 2016-035087 A | 3/2016 |
| JP | 5897834 B2 | 3/2016 |
| JP | 6037671 B2 | 12/2016 |
| JP | 2017-017084 A | 1/2017 |
| JP | 2017-059670 A | 3/2017 |
| WO | 2013011923 A1 | 1/2013 |

OTHER PUBLICATIONS

International Search Report; Written Opinion; and Notification of Transmittal of the International Search Report and the Written Opinion of the International Searching Authority, or the Declaration issued in PCT/JP2017/014395; dated Jun. 6, 2017.

An Office Action; "Notice of Reasons for Refusal," mailed by the Japanese Patent Office dated Jul. 14, 2020, which corresponds to Japanese Patent Application No. 2019-511025 and is related to U.S. Appl. No. 16/474,161 with English language translation.

An Office Action mailed by the State Intellectual Property Office of the People's Republic of China dated Jan. 25, 2021, which corresponds to Chinese Patent Application No. 201780089179.4 and is related to U.S. Appl. No. 16/474,161; with English language translation.

* cited by examiner

SIC EPITAXIAL WAFER, METHOD FOR MANUFACTURING SIC EPITAXIAL WAFER, SIC DEVICE, AND POWER CONVERSION APPARATUS

FIELD

The present invention relates to a silicon carbide (hereinafter described as SiC) epitaxial wafer, a method for manufacturing the SiC epitaxial wafer, a SiC device, and a power conversion apparatus.

BACKGROUND

SiC is expected to be one of power semiconductor materials of the next generation. SiC is known to have many crystal polymorphs, and a 4H type is often used for power device applications. Since SiC has many crystal polymorphs, it can be converted to another crystal polymorph with little energy. Therefore, in order to keep the crystal polymorph identical to that of the substrate, step-flow growth in which a SiC epitaxial layer is grown on the substrate surface inclined at 4° to 8° from the [0001] crystal axis is generally performed. The inclination angle of the substrate surface is called an off-angle, and the inclination is often made in the [11-20] direction from the [0001] crystal axis.

When the step-flow growth is used, crystal defects have a length corresponding to the thickness of the grown film along the off direction from the starting point. One example of specific epitaxy defects of SiC epitaxial layer is a triangular defect which appears in a triangular shape on the surface of an epitaxial wafer. Decreasing the amount of foreign matter adhering to the wafer surface before growth (for example, refer to PTL 1 and 2) and adjusting the epitaxial layer conditions at the initial stage of growth (for example, refer to PTL 3 and 4) have been suggested as techniques for reducing the triangular defects.

CITATION LIST

Patent Literature

[PTL 1] Japanese Patent No. 5897834
[PTL 2] Japanese Patent No. 6037671
[PTL 3] Japanese Patent Application Publication No. 2013-14469
[PTL 4] Japanese Patent No. 4987792

SUMMARY

Technical Problem

However, no technique has been suggested to reduce triangular defects generated due to SiC grains during epitaxial growth in a growth furnace.

The present invention has been accomplished to solve the above-described problems, and it is an object of the present invention to obtain a SiC epitaxial wafer capable of improving the chip yield of devices, a method for manufacturing the SiC epitaxial wafer, a SiC device, and a power conversion apparatus.

Solution to Problem

A SiC epitaxial wafer according to the present invention includes: a SiC substrate having an off angle $\theta°$; and a SiC epitaxial layer provided on the SiC substrate and having a film thickness of Tm μm, wherein triangular defects are formed on a surface of the SiC epitaxial layer, a density of triangular defects having a length of Tm/Tan $\theta$×0.9 or more in a substrate off direction is denoted by A, a density of triangular defects having a length shorter than Tm/Tan $\theta$×0.9 in the substrate off direction is denoted by B, and B/A≤0.5 is satisfied.

Advantageous Effects of Invention

In the present invention, the density of triangular defects having a length of Tm/Tan $\theta$×0.9 or more in the substrate off direction is denoted by A, the density of triangular defects having a length shorter than Tm/Tan $\theta$×0.9 in the substrate off direction is denoted by B, and B/A≤0.5 is satisfied. Since the density of triangular defects that cause a device failure is thus reduced, it is possible to improve the chip yield of the devices.

DESCRIPTION OF EMBODIMENTS

A SiC epitaxial wafer, a method for manufacturing the SiC epitaxial wafer, a SiC device, and a power conversion apparatus according to the embodiments of the present invention will be described with reference to the drawings. The same components will be denoted by the same symbols, and the repeated description thereof may be omitted.

Embodiment 1

Figure 1:
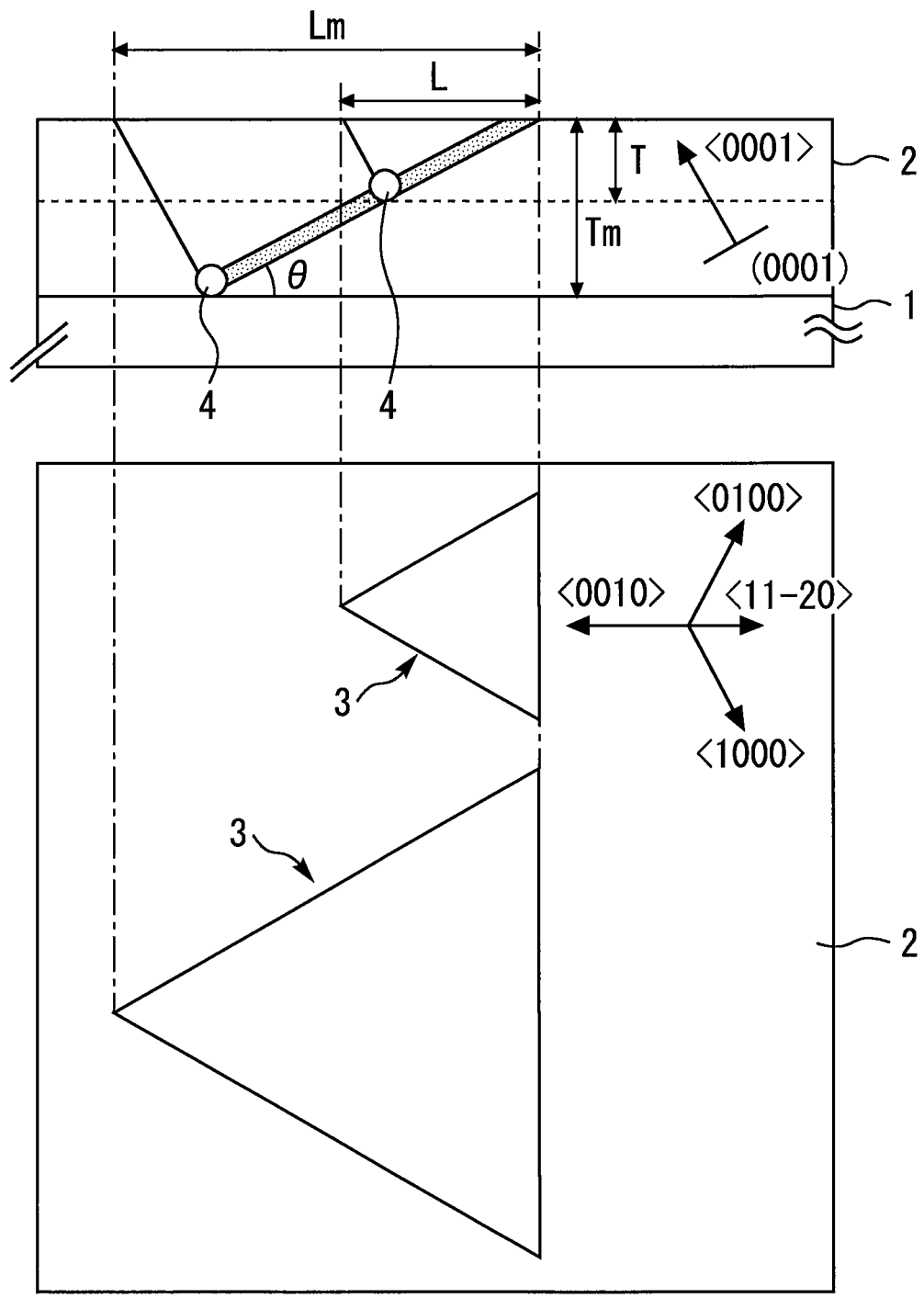
FIG. 1 is a cross-sectional view and a top view showing a SiC epitaxial wafer according to Embodiment 1 of the present invention.

FIG. 1 is a cross-sectional view and a top view showing a SiC epitaxial wafer according to Embodiment 1 of the present invention. A SiC substrate 1 has a crystal polymorphism of a 4H type, an n-type conductivity, and an inclination at an off angle $\theta=4°$ from the [0001] crystal axis. An n-type SiC epitaxial layer 2 is formed on the SiC substrate 1. The film thickness of the SiC epitaxial layer 2 is Tm (μm).

Triangular defects 3 are formed on the surface of the SiC epitaxial layer 2. Starting points 4 of the triangular defects 3, such as in-furnace foreign matter at the initial stage of growth, atom nucleation, and polishing damage of the wafer surface, are mostly generated in the vicinity of the interface between the SiC substrate 1 and the SiC epitaxial layer 2 at the initial stage of growth. However, there are also cases where triangular defects are generated due to two-dimensional nuclei formed during epitaxial growth.

The length Lm (μm), in the substrate off direction, of the triangular defect starting from the interface between the SiC substrate 1 and the SiC epitaxial layer 2 satisfies Lm=Tm/Tan θ. Meanwhile, in the case of a triangular defect generated during epitaxial growth of the SiC epitaxial layer 2, assuming that the film thickness from the starting point to the surface of the SiC epitaxial layer 2 is T, the length L (μm) in the substrate off direction satisfies L=T/Tan θ. Therefore, in the triangular defect generated during the epitaxial growth of the SiC epitaxial layer 2, the length L (μm) in the substrate off-angle direction satisfies L<Tm/Tan θ.

Further, the results of analysis of a plurality of defective chips made it clear that among the triangular defects generated during epitaxial growth, those having a light emission wavelength peak at 510 nm to 570 nm as determined by photoluminescence (PL) measurement become a current leak source thereby causing a device failure. The PL measurement is an evaluation method in which a measurement sample is irradiated with light having energy higher than the band gap of the sample, and weak PL light emitted from the sample is observed. By using a filter that transmits a light having a specific wavelength and capturing the PL light emitted from the sample plane, a planar PL image can be obtained. It has become clear that these starting points are 3C-type SiC grains of about 100 nm to 500 nm. Such SiC grains have a stacking structure of a 3C type different from the 4H type which is the crystal type of the SiC substrate 1. Based on the size of the foreign matter as a starting point, it is conceivable that the SiC grains that are the starting points are generated by the detachment of fine SiC adhering to parts such as the susceptor in the growth furnace during epitaxial growth, rather than generated by two-dimensional nuclei growth.

Therefore, in the present embodiment, where the density of triangular defects having a length of Tm/Tan θ×0.9 or more in the substrate off direction is denoted by A, and the density of triangular defects having a length smaller than Tm/Tan θ×0.9 in the substrate off direction is denoted by B, B/A≤0.5 is satisfied. That is, as compared with triangular defects generated before the start of growth, triangular defects generated during growth are suppressed. However, the wafer film thickness has an in-plane distribution, and assuming that the difference between the maximum value and the minimum value of the wafer film thickness is 10% at the maximum, the computational formula is multiplied by 0.9. Since the density of triangular defects that cause a device failure is thus reduced, it is possible to improve the chip yield of the devices. Moreover, it is preferable that the density B of triangular defect be 0.5/cm² or less.

Figure 2:
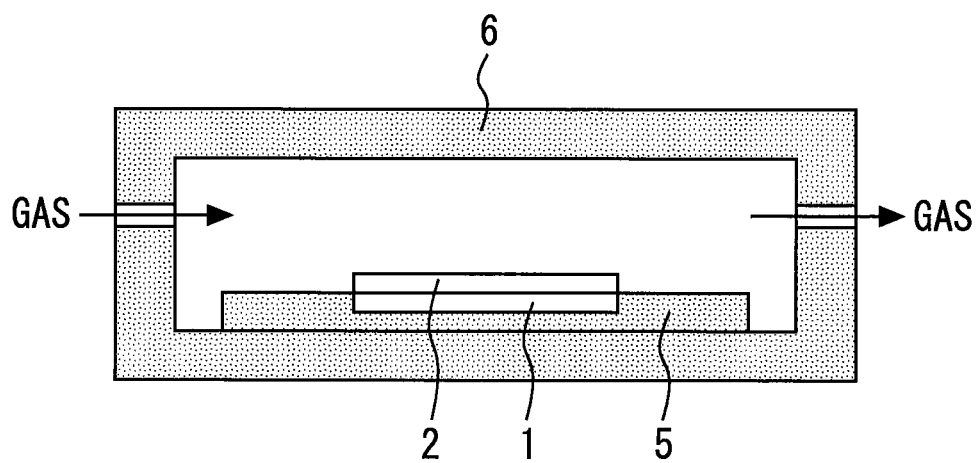
FIG. 2 is a cross-sectional view showing a step of manufacturing the SiC epitaxial wafer according to Embodiment 1 of the present invention.

FIG. 2 is a cross-sectional view showing a step of manufacturing the SiC epitaxial wafer according to Embodiment 1 of the present invention. An n-type SiC substrate 1 having an off angle of 4° is prepared, and the SiC substrate 1 is placed on a wafer holder 5 and accommodated in a susceptor 6. By preparing the SiC substrate 1 having a polishing flaw depth of 10 nm or less on the surface, the generation of triangular defects caused by polishing damage can be suppressed.

Hydrogen gas is caused to flow as a carrier gas into the susceptor 6, and the internal temperature of the susceptor 6 is raised to a predetermined temperature, for example 1600° C., by induction heating or resistance heating etc. The SiC substrate 1 is heated by radiant heat or heat conduction etc. After the predetermined temperature has been reached, the temperature is maintained for a predetermined time, and gas etching is performed before epitaxial growth. Source gases and a dopant gas are supplied into the susceptor 6 to grow the SiC epitaxial layer 2 on the SiC substrate 1. The source gases are a silane-based gas such as monosilane and a hydrocarbon-based gas such as propane. The dopant gas is nitrogen. For example, the growth temperature is 1550° C., the growth pressure is 9 kPa, the monosilane flow rate is 200 ccm, the propane flow rate is 70 ccm, the C/Si ratio is 1.05, and the nitrogen flow rate is 100 ccm.

As the epitaxial growth progresses, SiC three-dimensionally grows on the wafer holder 5 and the susceptor 6. It is conceivable that fine SiC grains attached by a weak force to the wafer holder 5 and the susceptor 6 are detached by gas flow or thermal stress and adhere to the wafer thereby causing triangular defects. Parts are usually not replaced with each growth, and SiC deposited in the previous growth is attached to parts such as the wafer holder 5 and the susceptor 6. SiC grains with weak adhesion are removed before arranging the wafer by gas purging which evacuates the furnace and thereafter introduces a gas to return to atmospheric pressure, by raising and lowering the temperature in the furnace, by causing pressure fluctuation at the initial stage of growth, or by raising the temperature, and the like. As the grown film thickness of the SiC epitaxial layer 2 increases, the amount of SiC three-dimensionally grown on the parts inside the furnace increases. In particular, where a film is continuously grown to a thickness of 30 μm or more, the probability of detachment of SiC three-dimensionally growing on the parts inside the furnace starts to increase significantly, and the triangular defect density during growth becomes about tenfold that when the film thickness is 5 μm.

In order to suppress the detachment of SiC grains during epitaxial growth, the C/Si ratio, which is the atomic ratio of Si contained in the silane-based gas and C contained in the silicon carbide-based gas, is preferably 1.1 or less, the pressure in the furnace during growth is preferably 9 kPa or less, and the growth temperature is preferably 1550° C. or more. Further, a chlorine-based gas such as hydrogen chloride may be introduced at the time of etching and growth.

In addition, a large heat distribution is imparted to the susceptor 6, and the temperature of the susceptor 6 at a portion directly above the SiC substrate 1 is made higher than the temperature of the susceptor 6 other than the portion. As a result, SiC is selectively deposited on a portion of the susceptor 6 where the temperature is low, and three-dimensional growth of SiC directly above the SiC substrate 1 is suppressed, so that SiC grain detachment during growth can be suppressed.

Further, the gas flow between the susceptor 6 and the SiC substrate 1 is separated into a plurality of layers, H2, which is a carrier gas, is used as a gas flowing on the susceptor 6 side, and the flow velocity thereof is made higher than that of the gas flowing on the SiC substrate 1 side. As a result, three-dimensional growth of SiC on the susceptor 6 can be suppressed, so that triangular defects generated during growth can be suppressed.

In addition, the susceptor 6 or the wafer holder 5 having a SiC coat deposited on a surface of a base material such as carbon is used. As a result, the adhesion to SiC increases, and it becomes difficult to detach SiC grains during growth. Furthermore, it is preferable to increase the C/Si ratio of the SiC coat as the film thickness increases, and to make the C/Si ratio of the outermost surface the same as that of the SiC epitaxial layer. For example, the C/Si ratio of the SiC coat at the start of deposition is made 0.9, and the C/Si ratio of the outermost surface of the SiC coat is made 1.1. During the deposition of the Si coat, the C/Si ratio may be changed continuously or intermittently, and the deposition may be divided into a plurality of steps.

Further, when the susceptor 6 or the wafer holder 5 having unevenness on the surface is used, the adhesion of the SiC deposit to the susceptor 6 or the wafer holder 5 increases, so that the SiC grains are unlikely to detach.

Under conventional growth conditions, the density of triangular defects with $L<Tm/\tan\theta$ is approximately $3/cm^2$. Meanwhile, by using the above-described growth conditions under which the SiC grains are unlikely to detach, it is possible to reduce the density to $1/cm^2$. Since the possibility of SiC grain falling off increases as SiC deposits on the members during epitaxial growth and the integrated film thickness increases, the effect of the present embodiment becomes more remarkable as the grown film thickness of the SiC epitaxial layer 2 increases. The effect is particularly remarkable when the thickness exceeds 10 μm. Since the effect becomes more remarkable as the film thickness increases, the density of triangular defects with $L<Tm/\tan\theta/2$ in the latter half of the growth is reduced, for example, to $2/cm^2$ under the conventional growth conditions, but in the present embodiment, the density becomes $1/cm^2$ or less. The size of SiC grains is mostly 1 μm or less.

Figure 3:
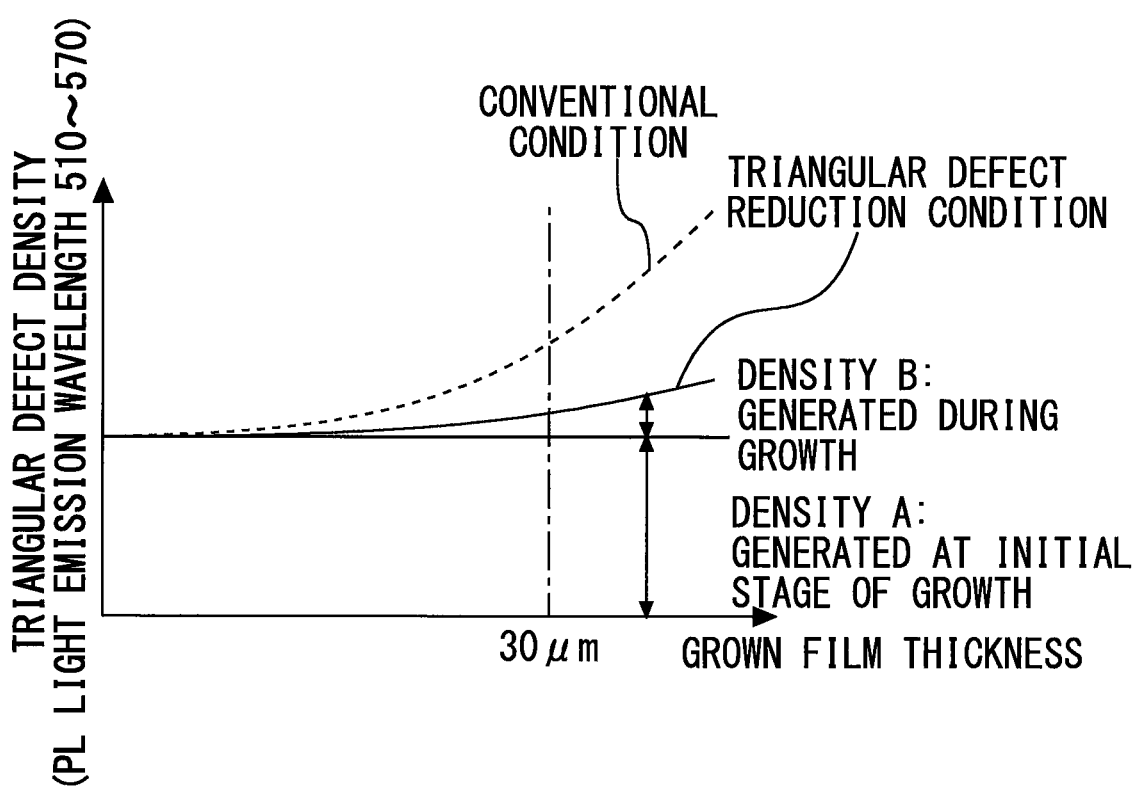
FIG. 3 shows the triangular defect density with respect to the grown film thickness.

FIG. 3 shows the triangular defect density with respect to the grown film thickness. The conventional conditions are a pressure of 10 kPa or more, C/Si of greater than 1.1, and 1550° C. or more. The triangular defect reduction conditions are a pressure of 9 kPa or less, C/Si of 1.1 or less, 1550° C. or more, and C/Si of the surface coat of the susceptor 6 is changed to 0.9 to 1.1. Under the triangular defect reduction conditions, the density of defects generated at the initial stage of growth is not changed as compared to the conventional conditions, but the density of defects generated during growth is reduced.

Figure 4:
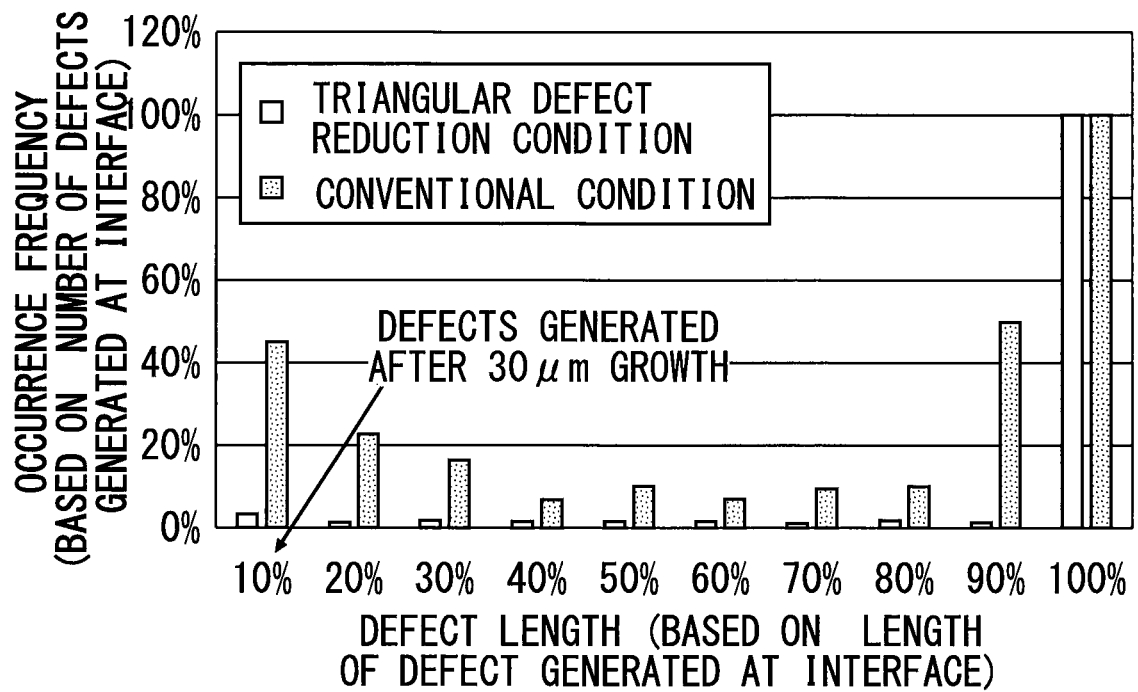
FIG. 4 shows a histogram of the length of triangular defects.
Figure 5:
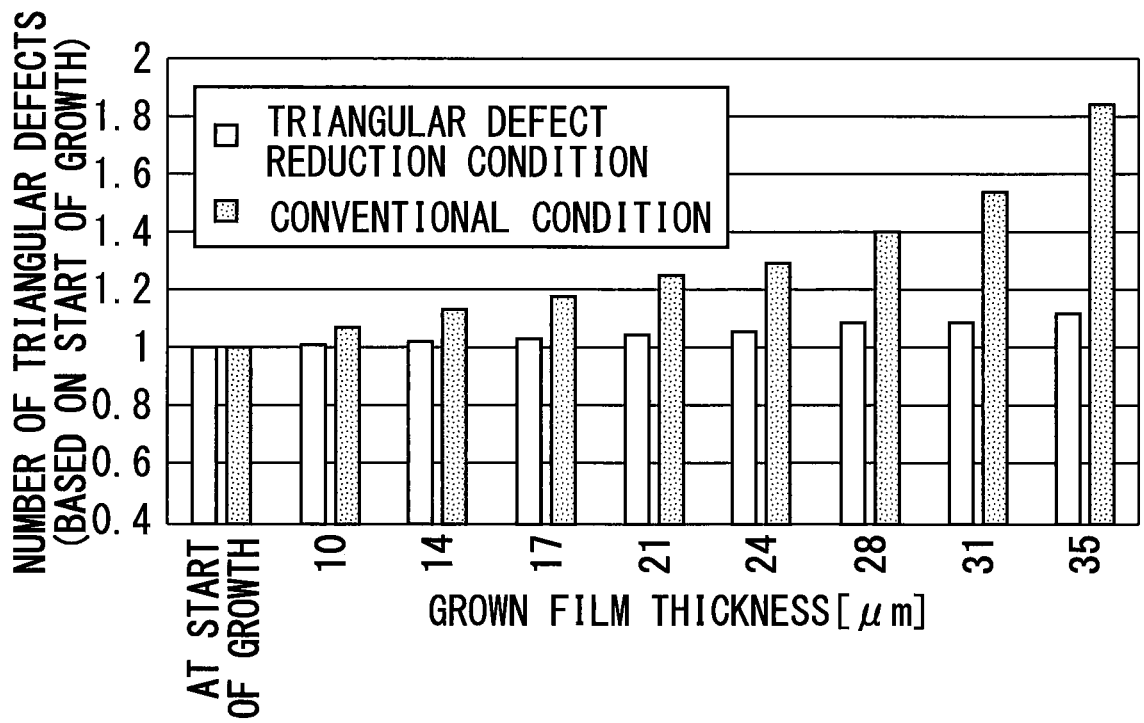
FIG. 5 shows the number of triangular defects with respect to the grown film thickness.

FIG. 4 shows a histogram of the length of triangular defects. The abscissa represents the defect length with the length of the longest defect generated at the interface between the substrate and the epitaxial layer being taken as 100%. The ordinate represents the occurrence frequency of defects with respect to the number of defects generated at the interface. Under the conventional conditions, the number of triangular defects increases with the grown film thickness, and the occurrence frequency of triangular defects exceeds 40% after 30 μm. Meanwhile, under the triangular defect reduction conditions, the generation of triangular defects with respect to the increase in the grown film thickness is suppressed. FIG. 5 shows the number of triangular defects with respect to the grown film thickness. The generation of triangular defects is suppressed under the triangular defect reduction conditions as compared with the conventional conditions.

Figure 6:
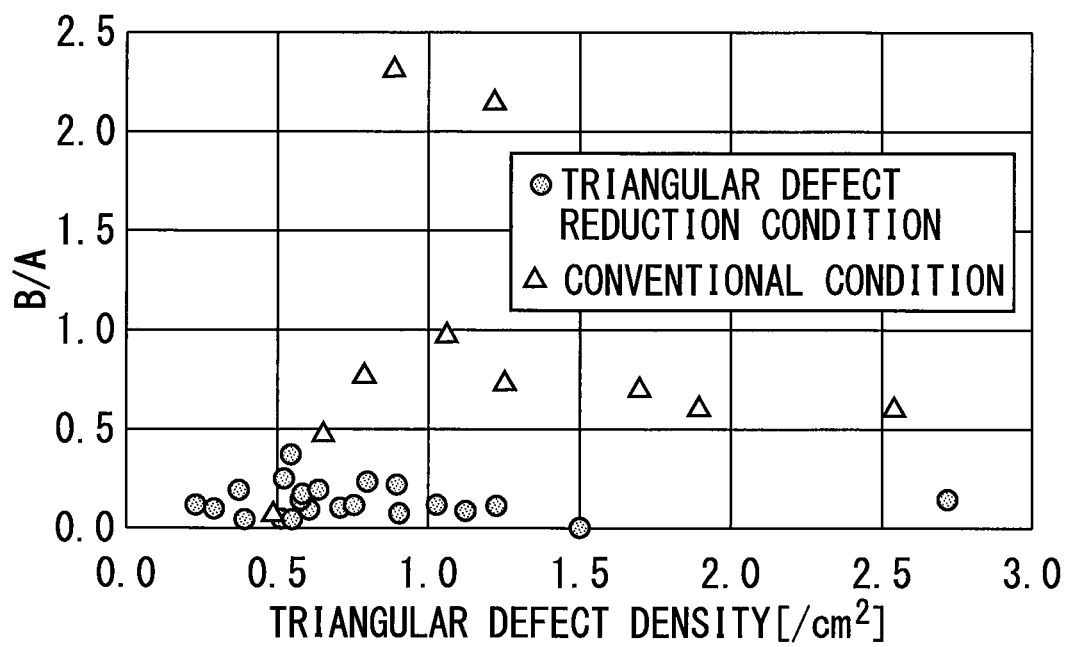
FIG. 6 shows B/A with respect to the triangular defect density.
Figure 7:
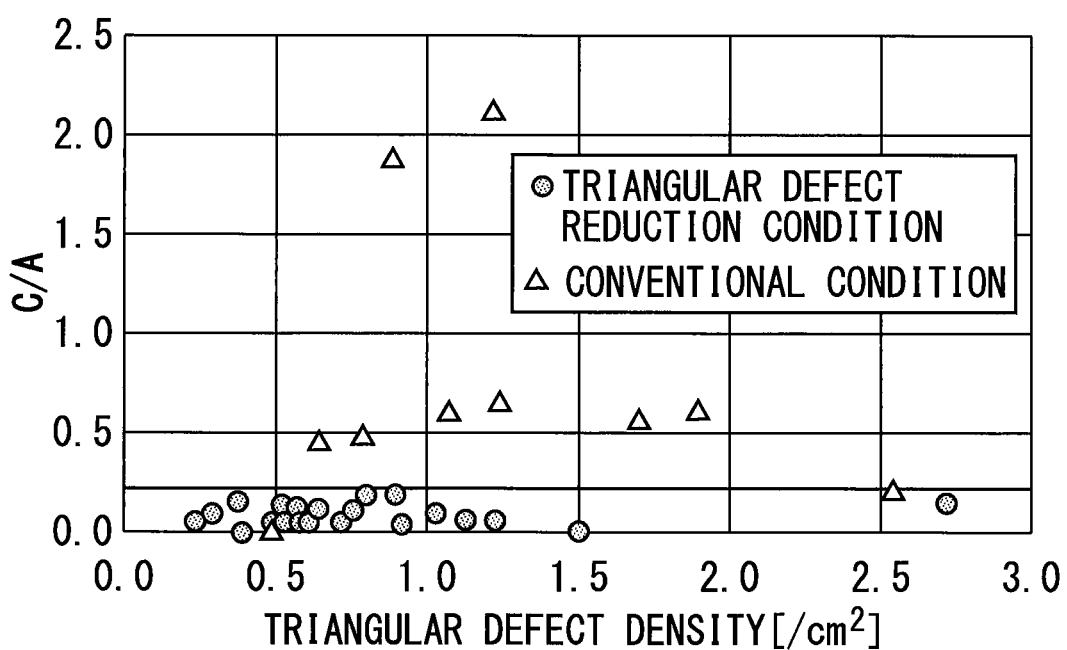
FIG. 7 shows C/A with respect to the triangular defect density.

FIG. 6 shows B/A with respect to the triangular defect density. Under the conventional conditions, B/A exceeds 0.5, whereas under the triangular defect reduction conditions, B/A is suppressed to 0.5 or less regardless of the triangular defect density. FIG. 7 shows C/A with respect to the triangular defect density. The density of triangular defects shorter than $Tm/\tan\theta \times 0.5$ is denoted by C. Under the conventional conditions, C/A generally exceeds 0.5, whereas under the triangular defect reduction conditions, C/A is suppressed to 0.2 or less.

Figure 8:
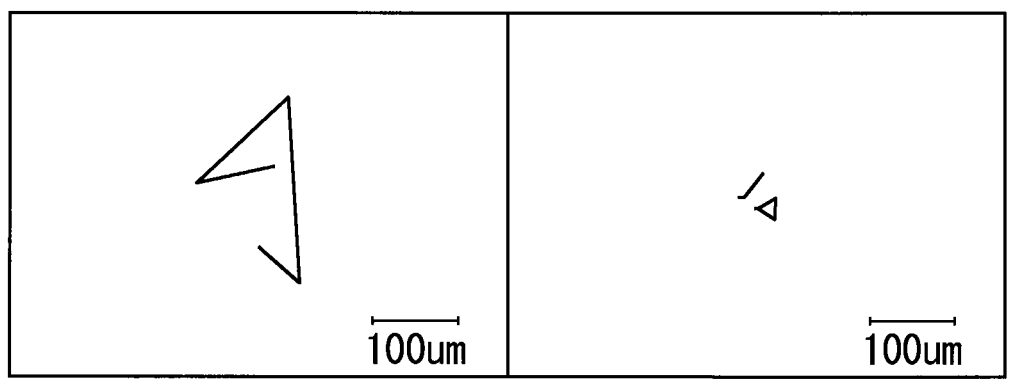
FIG. 8 shows an example of defects originating from SiC grains.
Figure 8:
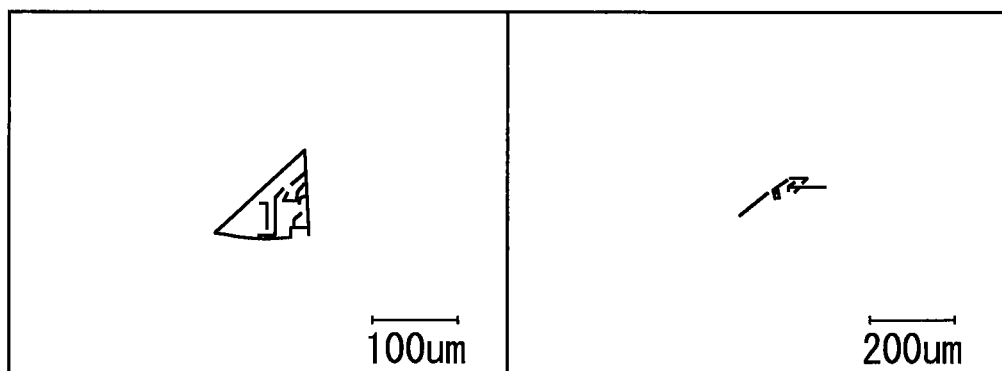

In the present embodiment, the case is explained in which the SiC substrate 1 and the SiC epitaxial layer 2 are of the n-type, but the same effect can be expected with the p-type. Further, the dopant gas is not limited to nitrogen, and the same effect can be obtained by using a gas including nitrogen or a gas including an element serving as an n-type dopant to SiC. The same effect can also be obtained even when the number of SiC epitaxial layers 2 is two or more. Further, in the present embodiment, triangular defects with an equilateral triangle shape on the epitaxial surface are used. However, in practice, the angles may vary, and defects that are of a non-triangular shape are also present. Therefore, a defect structure having stacking faults originating from SiC grains is also regarded as an object of the triangular defect of the present invention. FIG. 8 shows an example of defects originating from SiC grains.

Embodiment 2

Figure 9:
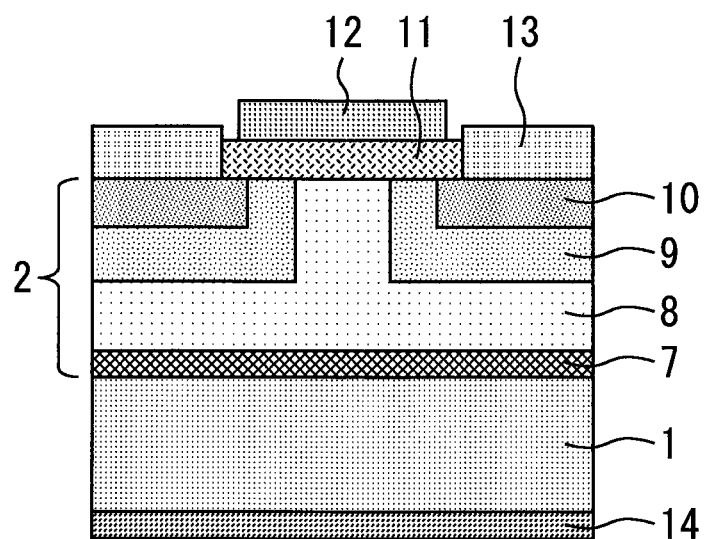
FIG. 9 is a cross-sectional view showing a SiC device according to Embodiment 2 of the present invention.

FIG. 9 is a cross-sectional view showing a SiC device according to Embodiment 2 of the present invention. This SiC device is a MOSFET using the SiC epitaxial wafer according to Embodiment 1. Therefore, the chip yield of the device can be improved.

A carrier concentration transition layer 7 and an n-type drift layer 8 are formed as a SiC epitaxial layer 2. During the growth of the carrier concentration transition layer 7, the flow rate and ratio of monosilane and propane and the nitrogen flow rate are adjusted to achieve a desired carrier concentration.

A photoresist of a desired pattern is formed on the surface of an n-type drift layer 8. Impurity ions are implanted using this photoresist as a mask to form a pair of p-type base regions 9 separated from each other. The p-type impurity is, for example, boron (B) or aluminum (Al). The mask is formed by a resist or the like, and an n-type source region 10 is formed on the surface of each p-type base region 9. After that, the mask is removed. The n-type impurity is, for example, phosphorus (P) or nitrogen (N). When the wafer is heat treated at a high temperature by a heat treatment apparatus, the n-type and p-type implanted ions are electrically activated.

A gate insulation film 11 is formed by thermal oxidation or deposition. A gate electrode 12 is formed on the gate insulating film 11 and patterned. The gate electrode 12 is patterned in such a shape that a pair of the p-type base region 9 and the n-type source region 10 is located at both ends, and the n-type drift layer 8 exposed between p-type base regions 9 is located at the center. The remaining part of the gate insulating film 11 above the n-type source region 10 is removed by lithography and etching. The source electrode 13 is formed on the exposed portion of the n-type source region 10 and patterned. An ohmic electrode 14 is formed on the back surface of the SiC substrate 1.

Embodiment 3

Figure 10:
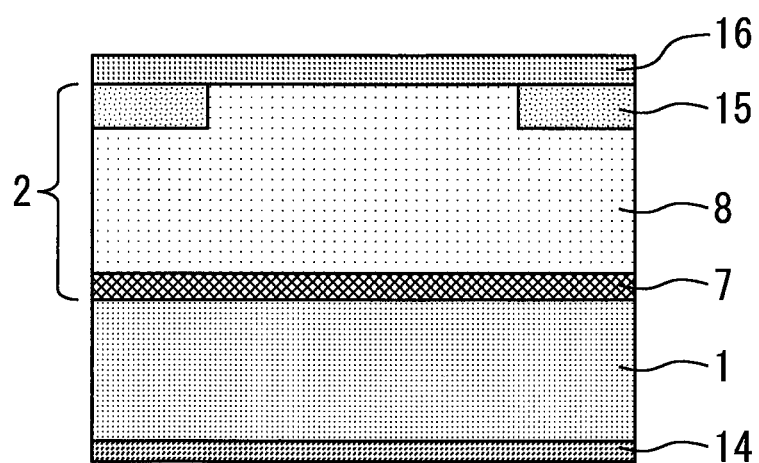
FIG. 10 is a cross-sectional view showing a SiC device according to Embodiment 3 of the present invention.

FIG. 10 is a cross-sectional view showing a SiC device according to Embodiment 3 of the present invention. This SiC device is a Schottky diode using the SiC epitaxial wafer according to Embodiment 1. Therefore, the chip yield of the device can be improved.

A photoresist of a desired pattern is formed on the surface of the n-type SiC epitaxial layer 2. Impurity ions are implanted using this photoresist as a mask to form a p-type ion implantation layer 15 in the SiC epitaxial layer 2. The mask and a sacrificial oxide film are removed. By performing activation annealing to activate the implanted impurity ions, a termination structure is formed to increase a breakdown voltage. An ohmic electrode 14 is formed on the back surface of the SiC substrate 1 and heat treatment is performed. A Schottky electrode 16 is formed on the surface of the SiC substrate 1.

The SiC device according to this embodiment which is formed of such a wide-bandgap semiconductor has a high voltage resistance and a high allowable current density, and thus can be miniaturized. The use of such a miniaturized SiC device enables the miniaturization of the semiconductor module in which the SiC device is incorporated. Further, since the SiC device has a high heat resistance, a radiation fin of a heatsink can be miniaturized and a water-cooled part can be air-cooled, which leads to further miniaturization of the semiconductor module. Further, since the device has a low power loss and a high efficiency, a highly efficient semiconductor module can be achieved.

Embodiment 4

In this embodiment, the SiC device according to Embodiment 2 or 3 described above are applied to an electric power conversion device. The electric power conversion device is, for example, an inverter device, a converter device, a servo amplifier, or a power supply unit. Although the present invention is not limited to a specific electric power conversion device, a case where the present invention is applied to a three-phase inverter will be described below.

Figure 11:
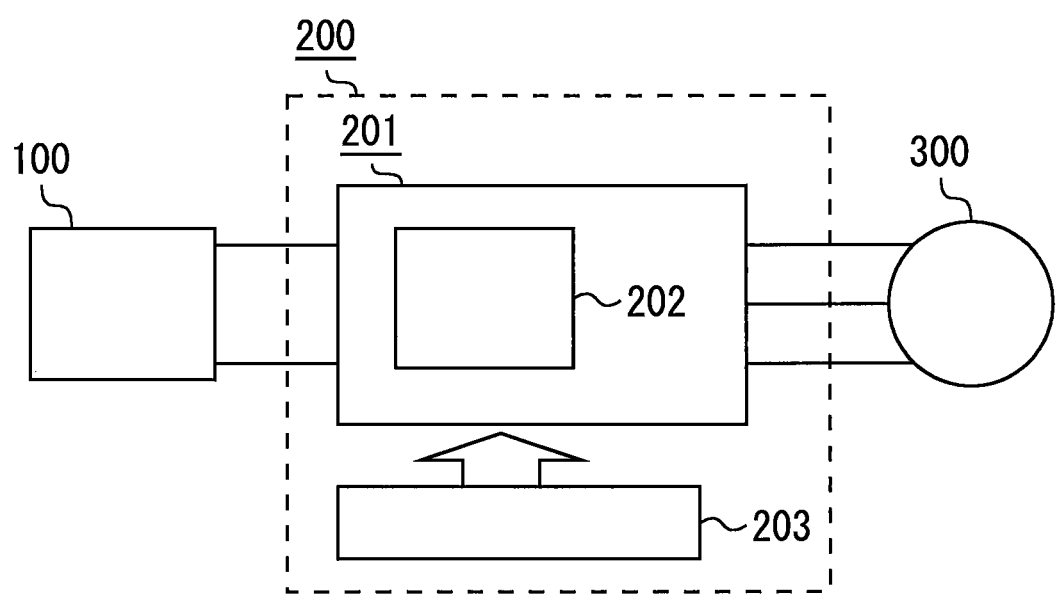
FIG. 11 is a block diagram illustrating a configuration of an electric power conversion system to which the electric power conversion device according to Embodiment 4 is applied.

FIG. 11 is a block diagram illustrating a configuration of an electric power conversion system to which the electric power conversion device according to Embodiment 4 is applied. This electric power conversion system includes a power supply 100, an electric power conversion device 200, and a load 300. The power supply 100 is a DC power supply and supplies DC power to the electric power conversion device 200. The power supply 100 can be composed of various components. For example, the power supply 100 can be composed of a DC system, a solar cell, or a storage battery, or may be composed of a rectifier or an AC/DC converter, which is connected to an AC system. Alternatively, the power supply 100 may be composed of a DC/DC converter that convers DC power output from a DC system to predetermined power.

The electric power conversion device 200 is a three-phase inverter connected to a node between the power supply 100 and the load 300, converts DC power supplied from the power supply 100 into AC power, and supplies the AC power to the load 300. The electric power conversion device 200 includes a main conversion circuit 201 that converts DC power into AC power and outputs the AC power, and a control circuit 203 that outputs a control signal for controlling the main conversion circuit 201 to the main conversion circuit 201.

The load 300 is a three-phase electric motor that is driven by AC power supplied from the electric power conversion device 200. The load 300 is not limited to a specific application. The load is used as an electric motor mounted on various electric devices, such as an electric motor for, for example, a hybrid vehicle, an electric vehicle, a railroad vehicle, an elevator, or an air-conditioner.

The electric power conversion device 200 will be described in detail below. The main conversion circuit 201 includes a switching device and a reflux diode (not illustrated). When the switching device is switched, the main conversion circuit 201 converts DC power supplied from the power supply 100 into AC power, and supplies the AC power to the load 300. The main conversion circuit 201 may have various types of specific circuit configurations. The main conversion circuit 201 according to this embodiment is a two-level three-phase full-bridge circuit, which can be composed of six switching devices and six reflux diodes connected in antiparallel with the respective switching devices. Each switching device and each reflux diode of the main conversion circuit 201 are composed of a SiC device 202 corresponding to Embodiment 2 or 3 described above. Every two switching devices of the six switching devices are connected in series and constitute a vertical arm. Each vertical arm constitutes each phase (U-phase, V-phase, W-phase) of the full-bridge circuit. Output terminals of each vertical arm, i.e., three output terminals of the main conversion circuit 201, are connected to the load 300.

Further, the main conversion circuit 201 includes a drive circuit (not illustrated) that drives each switching device. The drive circuit may be incorporated in the SiC device 202. Another drive circuit different from the SiC device 202 may be provided. The drive circuit generates a drive signal for driving each switching device of the main conversion circuit 201, and supplies the generated drive signal to a control electrode of each switching device of the main conversion circuit 201. Specifically, the drive circuit outputs, to the control electrode of each switching device, a drive signal for turning on each switching device and a drive signal for turning off each switching device, according to the control signal output from the control circuit 203, which is described later. When the ON-state of each switching device is maintained, the drive signal is a voltage signal (ON signal) having a voltage equal to or higher than a threshold voltage of the switching device. When the OFF-state of each switching device is maintained, the drive signal is a voltage signal (OFF signal) having a voltage equal to or lower than the threshold voltage of the switching device.

The control circuit 203 controls each switching device of the main conversion circuit 201 so as to supply a desired power to the load 300. Specifically, the control circuit 203 calculates a period (ON period), in which each switching device of the main conversion circuit 201 is in the ON state, based on the power to be supplied to the load 300. For example, the main conversion circuit 201 can be controlled by a PWM control for modulating the ON period of each switching device depending on the voltage to be output. Further, the control circuit 203 outputs a control command (control signal) to the drive circuit included in the main conversion circuit 201 so that the ON signal is output to each switching device to be turned on and an OFF signal is output to each switching device to be turned off at each point. The drive circuit outputs the ON signal or OFF signal, as the drive signal, to the control electrode of each switching device according to the control signal.

In the electric power conversion device according to this embodiment, the SiC device according to Embodiment 2 or 3 is applied as the SiC device 202. Accordingly, the chip yield of the SiC device 202 can be improved. Therefore, the yield of the power converter can also be improved.

While this embodiment illustrates an example in which the present invention is applied to a two-level three-phase inverter, the present invention is not limited to this and can be applied to various electric power conversion devices. While this embodiment illustrates a two-level electric power conversion device, the present invention can also be applied to a three-level or multi-level electric power conversion device. When power is supplied to a single-phase load, the present invention may be applied to a single-phase inverter. The present invention can also be applied to a DC/DC converter or an AC/DC converter when power is supplied to a DC load or the like.

Further, in the electric power conversion device to which the present invention is applied, the above-mentioned load is not limited to an electric motor. For example, the load may also be used as a power supply device for an electric discharge machine, a laser beam machine, an induction heating cooker, or a non-contact device power feeding system. More alternatively, the electric power conversion device may be used as a power conditioner for a photovoltaic power generating system, an electricity storage system, or the like.

REFERENCE SIGNS LIST

1 SiC substrate; 2 n-type SiC epitaxial layer; 3 triangular defect; 4 starting point; 5 wafer holder; 6 susceptor; 200 electric power conversion device; 201 main conversion circuit; 202 SiC device; 203 control circuit

The invention claimed is:
1. A SiC epitaxial wafer comprising:
a SiC substrate having an off angle $\theta°$; and
a SiC epitaxial layer provided on the SiC substrate and having a film thickness of Tm μm, wherein
triangular defects are formed on a surface of the SiC epitaxial layer,
a density of triangular defects having a length of Tm/Tan$\theta$×0.9 or more in a substrate off direction is denoted by A,
a density of triangular defects having a length shorter than Tm/Tan$\theta$×0.9 in the substrate off direction is denoted by B, and
B/A≤0.5 is satisfied.
2. The SiC epitaxial wafer according to claim 1, wherein the density B of the triangular defects is 0.5/cm$^2$ or less.
3. The SiC epitaxial wafer according to claim 1, wherein the film thickness Tm of the SiC epitaxial layer is 30 μm or more.
4. The SiC epitaxial wafer according to claim 1, wherein a density of triangular defects shorter than Tm/Tan$\theta$×0.5 is denoted by C, and C/A≤0.2 is satisfied.
5. The SiC epitaxial wafer according to claim 1, wherein the SiC epitaxial layer includes two or more layers.
6. A method for manufacturing the SiC epitaxial wafer according to claim 1, comprising:
placing the SiC substrate on a wafer holder and accommodating the SiC substrate placed on the wafer holder in a susceptor; and
supplying a source gas to grow the SiC epitaxial layer on the SiC substrate.
7. The method for manufacturing the SiC epitaxial wafer according to claim 6, wherein
a temperature of the susceptor at a portion directly above the SiC substrate is higher than a temperature of the susceptor other than the portion.
8. The method for manufacturing the SiC epitaxial wafer according to claim 6, wherein
a gas flow between a ceiling of the susceptor and the SiC substrate is separated into a plurality of layers, a gas flowing on the ceiling of the susceptor side is a carrier gas and has higher flow velocity than that of a gas flowing on the SiC substrate side.
9. The method for manufacturing the SiC epitaxial wafer according to claim 6, wherein
the susceptor or the wafer holder has a SiC coat deposited on a surface of a base material,
C/Si ratio of the SiC coat increases as a film thickness of the SiC increases, and
C/Si ratio of an outermost surface of the SiC coat is same as C/Si ratio of the SiC epitaxial layer.
10. The method for manufacturing the SiC epitaxial wafer according to claim 6, wherein
a surface of the susceptor or the wafer holder has unevenness.
11. A SiC device using the SiC epitaxial wafer according to claim 1.
12. A power conversion apparatus comprising:
a main conversion circuit including the SiC device according to claim 11, converting input power and outputting converted power; and
a control circuit outputting a control signal for controlling the main conversion circuit to the main conversion circuit.
13. The SiC epitaxial wafer according to claim 1, wherein the triangular defects are formed on the surface of the SiC epitaxial layer via at least one of in-furnace foreign matter, atom nucleation, polishing damage of a surface of the SiC epitaxial wafer, and two-dimensional nuclei formed during epitaxial growth.

* * * * *